United States Patent
Kawabata

(10) Patent No.: US 7,342,524 B2
(45) Date of Patent: Mar. 11, 2008

(54) WAVEFORM GENERATOR, WAVEFORM SHAPER, AND TESTING APPARATUS

(75) Inventor: Masayuki Kawabata, Tokyo (JP)

(73) Assignee: Advantest Corporation, Tokyo (JP)

( * ) Notice: Subject to any disclaimer, the term of this patent is extended or adjusted under 35 U.S.C. 154(b) by 85 days.

(21) Appl. No.: 11/442,884

(22) Filed: May 30, 2006

(65) Prior Publication Data

US 2007/0038405 A1 Feb. 15, 2007

(30) Foreign Application Priority Data

Jun. 1, 2005 (JP) .............................. 2005-161211

(51) Int. Cl.
*H03M 1/10* (2006.01)
(52) U.S. Cl. ....................... 341/120; 341/118; 702/124
(58) Field of Classification Search ........ 341/117–120; 702/124
See application file for complete search history.

(56) References Cited

U.S. PATENT DOCUMENTS

| | | | |
|---|---|---|---|
| 5,684,367 A * | 11/1997 | Moskowitz et al. ........ 315/246 |
| 5,706,061 A * | 1/1998 | Marshall et al. ............. 348/743 |
| 5,952,794 A * | 9/1999 | Bergman et al. ............. 315/307 |
| 6,249,106 B1 * | 6/2001 | Turner et al. ................ 320/136 |
| 6,624,593 B2 * | 9/2003 | Blanchard ............... 315/209 R |
| 6,646,845 B1 * | 11/2003 | Turner et al. .................. 361/86 |
| 6,696,800 B2 * | 2/2004 | Kramer et al. .............. 315/247 |
| 6,841,950 B1 * | 1/2005 | Walker .................... 315/169.3 |

* cited by examiner

*Primary Examiner*—Jean Bruner Janglaude
(74) *Attorney, Agent, or Firm*—Osha•Liang LLP

(57) ABSTRACT

There is provided a waveform generator that generates a waveform. The waveform generator includes: a lamp waveform generating section that generates a lamp wave of which a signal value linearly changes for a predetermined period; a square wave generating section that generates a square wave of which pulse width is generally equivalent to the predetermined period; a waveform adding section that generally accords a timing at which a signal value in the lamp wave begins to be changed and a timing at a leading edge of the square wave, to add the lamp wave and the square wave; and a low-pass filter that removes a predetermined frequency band component from a waveform output from the waveform adding section.

12 Claims, 9 Drawing Sheets

FIG. 2A  LAMP WAVE 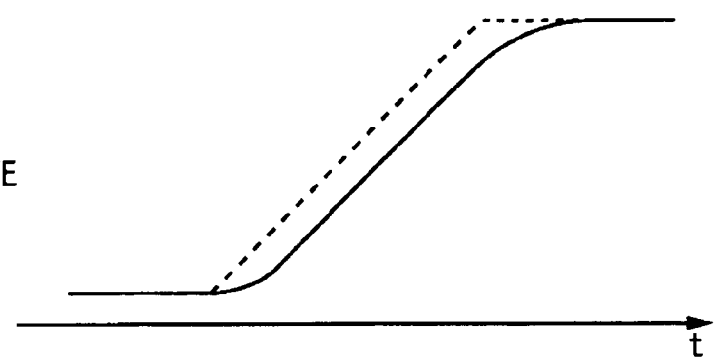
FIG. 2B  DIFFERENTIAL WAVEFORM 
FIG. 2C  SQUARE WAVE 

WAVEFORM GENERATOR, WAVEFORM SHAPER, AND TESTING APPARATUS

CROSS REFERENCE TO RELATED APPLICATION

The present application claims priority from a Japanese Patent Application No. 2005-161211 filed on Jun. 1, 2005, the contents of which are incorporated herein by reference.

BACKGROUND OF THE INVENTION

1. Field of the Invention

The present invention relates to a waveform generator that generates a lamp wave, a waveform shaper that shapes a lamp wave, and a testing apparatus that tests an AD converter. More particularly, the present invention relates to a waveform generator and a waveform shaper that generate a lamp wave with a low noise.

2. Related Art

Conventionally, as a method for testing an analog-digital converter (hereinafter, referred to as an ADC), a method for inputting a lamp wave into the ADC and testing whether the ADC normally operates in a voltage range of the lamp wave has been known. Here, a lamp wave is a waveform in which a voltage value linearly changes in a predetermined voltage range.

Moreover, it is desired to reduce a test cost in testing a device such as an ADC. As a method for reducing a test cost, it has been known to enhance a test throughput. For example, in testing an ADC by using a lamp wave, it is possible to shorten a testing time per one ADC and enhance a test throughput by using a high-speed lamp wave.

However, when a high-speed lamp wave is used in testing an ADC, it is necessary to broaden a bandwidth of a test circuit because inclination of the lamp wave becomes sharp. When a test circuit has an insufficient bandwidth, a distortion of a lamp waveform occurs. Moreover, when a bandwidth of a test circuit is broadened, noises overlapped on a lamp wave increases and thus a measurement variation increase. In this manner, in a conventional apparatus, it was difficult to generate a high-speed and low-noise lamp wave. For this reason, it was difficult to enhance a test throughput of an ADC.

SUMMARY OF THE INVENTION

Therefore, it is an object of the present invention to provide a waveform generator, a waveform shaper, and a testing apparatus that can solve the foregoing problems. The above and other objects can be achieved by combinations described in the independent claims. The dependent claims define further advantageous and exemplary combinations of the present invention.

That is to say, according to the first aspect of the present invention, there is provided a waveform generator that generates a waveform. The waveform generator includes: a lamp waveform generating section that generates a lamp wave of which a signal value linearly changes for a predetermined period; a square wave generating section that generates a square wave of which pulse width is generally equivalent to the predetermined period; a waveform adding section that generally accords a timing at which a signal value in the lamp wave begins to be changed and a timing at a leading edge of the square wave, to add the lamp wave and the square wave; and a low-pass filter that removes a predetermined frequency band component from a waveform output from the waveform adding section.

According to the second aspect of the present invention, there is provided a waveform generator that generates a waveform. The waveform generator includes: a lamp waveform generating section that generates a lamp wave of which a signal value linearly changes for a predetermined period; a square wave generating section that generates a square wave of which pulse width is generally equivalent to the predetermined period; a first low-pass filter that removes a predetermined frequency band component from the lamp wave; a second low-pass filter that has the generally same characteristic as that of the first low-pass filter and removes the frequency band component from the square wave; and a waveform adding section that generally accords a timing at which a signal value in the lamp wave begins to be changed and a timing at a leading edge of the square wave, to add the lamp wave output from the first low-pass filter and the square wave output from the second low-pass filter.

The square wave generating section may generate the square wave that has amplitude according to an inclination of the waveform of the lamp wave for the predetermined period and a time constant of the low-pass filters. The square wave generating section may generate the square wave that has amplitude according to a value made by multiplying an inclination of the waveform by the time constant. The waveform generator may further include an inclination detecting section that detects an inclination of a waveform of the lamp wave, and the square wave generating section may generate the square wave based on an inclination of the waveform detected from the inclination detecting section.

According to the third aspect of the present invention, there is provided a waveform shaper that removes noises from an input lamp wave. The waveform shaper includes: an inclination detecting section that detects an inclination of a waveform of the lamp wave; a period detecting section that detects a period for which a signal value in the lamp wave linearly changes; a square wave generating section that generates a square wave according to an inclination of the waveform detected from the inclination detecting section and the period detected from the period detecting section; a waveform adding section that generally accords a timing at which a signal value in the lamp wave begins to be changed and a timing at a leading edge of the square wave, to add the lamp wave and the square wave; and a low-pass filter that removes a predetermined frequency band component from a waveform output from the waveform adding section.

According to the fourth aspect of the present invention, there is provided a waveform shaper that removes noises from an input lamp wave. The waveform shaper includes: an inclination detecting section that detects an inclination of a waveform of the lamp wave; a period detecting section that detects a period for which a signal value in the lamp wave linearly changes; a square wave generating section that generates a square wave according to an inclination of the waveform detected from the inclination detecting section and the period detected from the period detecting section; a waveform adding section that generally accords a timing at which a signal value in the lamp wave begins to be changed and a timing at a leading edge of the square wave, to add the lamp wave and the square wave; a first low-pass filter that removes a predetermined frequency band component from the lamp wave; a second low-pass filter that has the generally same characteristic as that of the first low-pass filter and removes the frequency band component from the square wave; and a waveform adding section that generally accords a timing at which a signal value in the lamp wave begins to be changed and a timing at a leading edge of the square wave, to add the lamp wave output from the first low-pass filter and the square wave output from the second low-pass filter.

According to the fifth aspect of the present invention, there is provided a testing apparatus that tests an AD converter. The testing apparatus includes: a waveform generator that generates a lamp wave to be input into the AD converter; and a decider that decides the good or bad of the AD converter based on a digital signal output from the AD converter according to the lamp wave, in which the waveform generator includes: a lamp waveform generating section that generates the lamp wave of which a signal value linearly changes for a predetermined period; a square wave generating section that generates a square wave of which pulse width is generally equivalent to the predetermined period; a waveform adding section that generally accords a timing at which a signal value in the lamp wave begins to be changed and a timing at a leading edge of the square wave, to add the lamp wave and the square wave; and a low-pass filter that removes a predetermined frequency band component from a waveform output from the waveform adding section.

According to the sixth aspect of the present invention, there is provided a testing apparatus that tests an AD converter. The testing apparatus includes: a waveform generator that generates a lamp wave to be input into the AD converter; and a decider that decides the good or bad of the AD converter based on a digital signal output from the AD converter according to the lamp wave, in which the waveform generator includes: a lamp waveform generating section that generates a lamp wave of which a signal value linearly changes for a predetermined period; a square wave generating section that generates a square wave of which pulse width is generally equivalent to the predetermined period; a first low-pass filter that removes a predetermined frequency band component from the lamp wave; a second low-pass filter that has the generally same characteristic as that of the first low-pass filter and removes the frequency band component from the square wave; and a waveform adding section that generally accords a timing at which a signal value in the lamp wave begins to be changed and a timing at a leading edge of the square wave, to add the lamp wave output from the first low-pass filter and the square wave output from the second low-pass filter.

In addition, the summary of the invention does not necessarily describe all necessary features of the present invention. The present invention may also be a sub-combination of the features described above.

BRIEF DESCRIPTION OF THE DRAWINGS

FIG. 2A is a view exemplary showing a waveform of a lamp wave.

FIG. 2B is a view showing a differential waveform between a lamp wave input into a low-pass filter and a lamp wave output from the low-pass filter.

FIG. 2C is a view exemplary showing a waveform of a predetermined square wave.

DETAILED DESCRIPTION OF THE INVENTION

Hereinafter, the invention will now be described based on the preferred embodiments, which do not intend to limit the scope of the present invention, but exemplify the invention. All of the features and the combinations thereof described in the embodiments are not necessarily essential to the invention.

Figure 1:
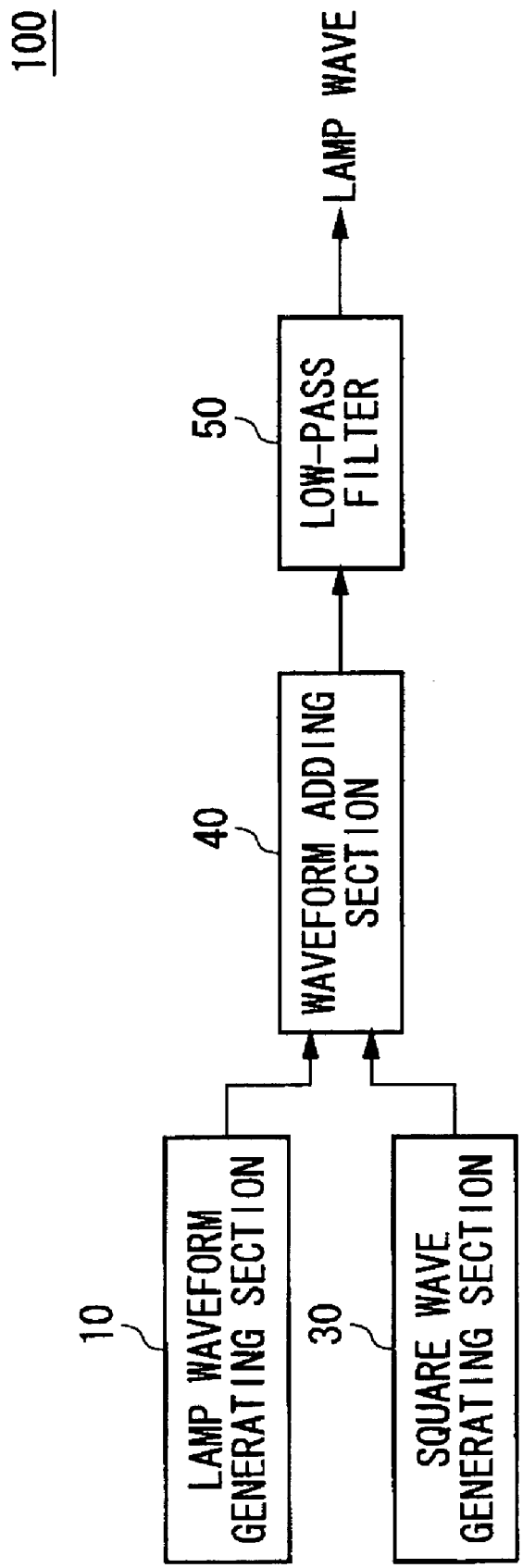
FIG. 1 is a view exemplary showing a configuration of a waveform generator according to an embodiment of the present invention.

FIG. 1 is a view exemplary showing a configuration of a waveform generator 100 according to an embodiment of the present invention. The waveform generator 100 is an apparatus that generates a high-speed and low-noise lamp wave. Moreover, the waveform generator 100 includes a lamp waveform generating section 10, a square wave generating section 30, a waveform adding section 40, and a low-pass filter 50.

The lamp waveform generating section 10 generates a lamp wave generally equal to a lamp wave to be output from the waveform generator 100. The low-pass filter 50 removes noises from the lamp wave output from the lamp waveform generating section 10 and outputs the lamp wave. In the present example, the low-pass filter 50 is a primary filter having, for example, a resistor and a capacitor. In this way, the waveform generator 100 outputs the low-noise lamp wave. However, when the low-pass filter 50 is used for removing noises, a lamp wave is distorted according to a characteristic of the low-pass filter 50.

FIGS. 2A to 2C are views explaining distortion of a lamp wave output from the low-pass filter 50. FIG. 2A is a view exemplary showing a waveform of a lamp wave. In FIGS. 2A to 2C, a lamp wave input into the low-pass filter 50 is shown with a dashed line and a waveform output from the low-pass filter 50 is shown with a solid line.

A lamp wave output from the lamp waveform generating section 10 has high frequency components at a starting point and an ending point of an edge thereof. For this reason, a waveform of a lamp wave passing the low-pass filter 50 gets dull at a starting point and an ending point of an edge thereof as shown in FIG. 2A.

FIG. 2B is a view showing a differential waveform between the lamp wave input into the low-pass filter 50 and the lamp wave output from the low-pass filter 50. The lamp wave output from the low-pass filter 50 has an error as shown in FIG. 2B in comparison with a waveform of a lamp wave to be output from the waveform generator 100.

FIG. 2C is a view exemplary showing a waveform of a predetermined square wave. In FIG. 2C, a waveform of an original square wave is shown with a dashed line and a waveform of a square wave passing the low-pass filter 50 is shown with a solid line. As shown in FIG. 2C, the waveform of the square wave passing the low-pass filter 50 resembles the reversed one of the differential waveform shown in FIG. 2B.

As shown in FIGS. 2B and 2C, it is possible to generally identify the waveform of the square wave passing the low-pass filter 50 with the reversed waveform of the differential waveform shown in FIG. 2B by adjusting amplitude of a square wave. That is to say, it is possible to compensate a distortion of a waveform in the low-pass filter 50 by previously overlapping a square wave having the adjusted amplitude on a lamp wave and inputting the overlapped wave into the low-pass filter 50.

Figure 3:
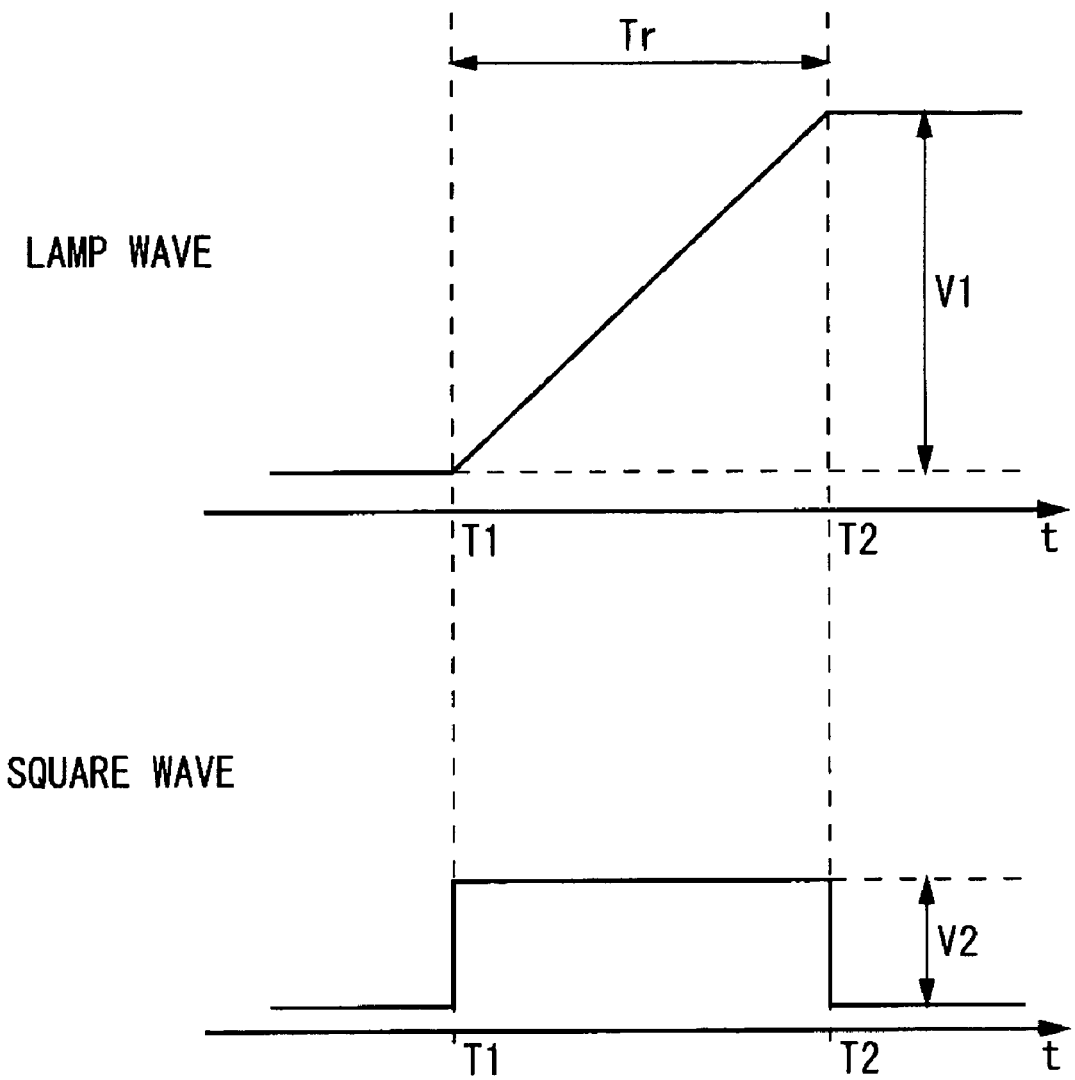
FIG. 3 is a view exemplary showing waveforms of a lamp wave generated from a lamp waveform generating section and a square wave generated from a square wave generating section.

FIG. 3 is a view exemplary showing waveforms of a lamp wave generated from the lamp waveform generating section 10 and a square wave generated from the square wave generating section 30. As shown in FIG. 3, the lamp waveform generating section 10 generates a lamp wave of which a signal value linearly changes for a predetermined period (Tr). In the present example, the lamp waveform generating section 10 generates a lamp wave of which a signal value increases at a predetermined increase rate for the predetermined period (Tr).

The square wave generating section 30 generates a square wave of which pulse width is generally equivalent to the predetermined period (Tr). Here, a timing T1 at which a signal value, in a lamp wave generated from the lamp waveform generating section 10, begins to be changed is generally same as a timing T1 at a leading edge of a square wave generated from the square wave generating section 30. Moreover, a timing T2 at which the change of the signal value in the lamp wave is terminated is generally same as a timing T2 at a trailing edge of the square wave. Moreover, when a signal value of a lamp wave increases for the period (Tr), the square wave generating section 30 generates a square wave having a rising edge as its leading edge and a falling edge as its trailing edge. Moreover, when a signal value of a lamp wave decreases for the period (Tr), the square wave generating section 30 generates a square wave having a falling edge as its leading edge and a rising edge as its trailing edge.

The waveform adding section 40 generally accords a timing at which a signal value, in the lamp wave output from the lamp waveform generating section 10, begins to be changed and a timing at a leading edge of the square wave output from the square wave generating section 30, in order to add the lamp wave and the square wave. Moreover, the waveform adding section 40 inputs the added waveform into the low-pass filter 50. In this way, as described in FIGS. 2A to 2C, it is possible to compensate a distortion of a waveform in the low-pass filter 50.

Moreover, it is preferable that the square wave generating section 30 generates a square wave having amplitude generally equal to that of the differential waveform described in FIGS. 2A to 2C. The amplitude of the differential waveform is determined by means of an inclination of a waveform of a lamp wave and a time constant of the low-pass filter 50. Here, the inclination of a waveform of a lamp wave is a value obtained by dividing amplitude V1 of the lamp wave by the predetermined period Tr. In other words, it is preferable that the square wave generating section 30 generates a square wave having amplitude according to an inclination of a waveform of a lamp wave and a time constant of the low-pass filter 50.

Specifically, the square wave generating section 30 generates a square wave with amplitude according to the following equation. In the following equation, V2 shows amplitude of a square wave, τ shows a time constant of the low-pass filter 50, and A shows an inclination of a waveform of a lamp wave.

$$V2 = V1 \times \tau / Tr = \tau \times A \tag{1}$$

The square wave generating section 30 may be supplied with a time constant of the low-pass filter 50 and an inclination of a lamp wave generated from the lamp waveform generating section 10. Moreover, the waveform generator 100 may further include an inclination detecting section for detecting an inclination of a waveform of a lamp wave generated from the lamp waveform generating section 10. In this case, the inclination detecting section informs the square wave generating section 30 of the detected inclination.

According to the waveform generator 100 in the present example, it is possible to generate a lamp wave with a reduced noise and a small waveform distortion. Moreover, since a distortion of a waveform of a lamp wave is compensated according to a frequency characteristic of a circuit such as the low-pass filter 50, it is possible to generate a lamp wave with good linearity regardless of a frequency characteristic of a circuit. For this reason, it is possible to generate a high-speed lamp wave and thus shorten, e.g., a testing time of an ADC.

Figure 4:
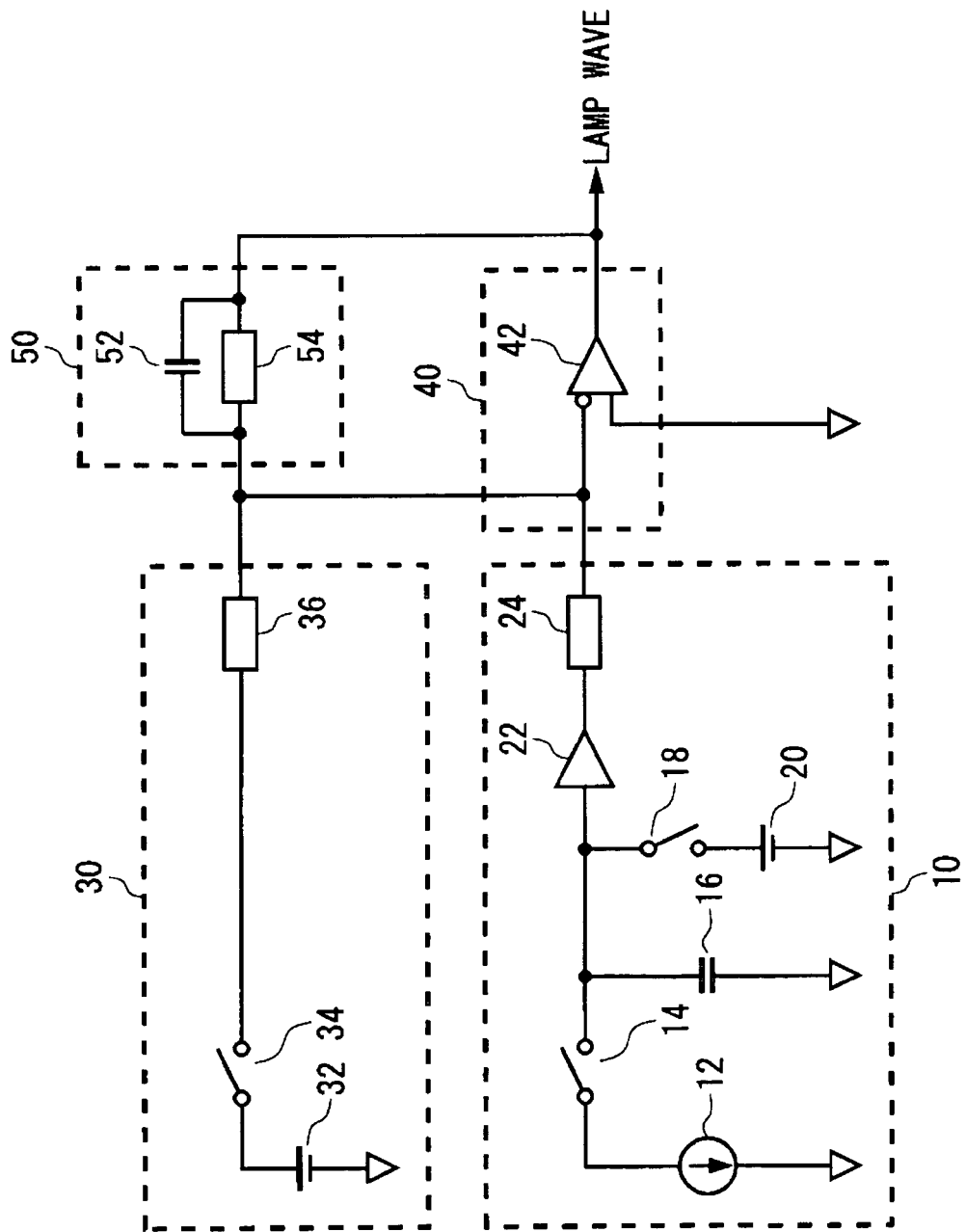
FIG. 4 is a view exemplary showing a circuit configuration of a waveform generator.

FIG. 4 is a view exemplary showing a circuit configuration of the waveform generator 100. The lamp waveform generating section 10 in the present example has a current source 12, a switch 14, a capacitor 16, a switch 18, a voltage source 20, a buffer 22, and a resistance component 24.

The current source 12 is connected to the capacitor 16 via the switch 14. In other words, the current source 12 charges the capacitor 16 while the switch 14 is turned on. The capacitor 16 is charged by the current source 12, and generates a voltage according to the charged electric charges. In the present example, the switch 14 is controlled to be the ON state for a predetermined period (Tr). In this way, the capacitor 16 generates a lamp wave having an inclination according to an electric current generated from the current source 12.

The voltage source 20 is connected to the capacitor 16 via the switch 18. The voltage source 20 prescribes an initial voltage of the capacitor 16. In other words, since the voltage source 20 is connected to the capacitor 16 before the current source 12 is connected to the capacitor 16, an initial voltage according to a voltage generated from the voltage source 20 is applied to the capacitor 16. After that, a lamp wave is generated by opening the switch 18 and short-circuiting the switch 14. The capacitor 16 outputs the lamp wave to the waveform adding section 40 via the buffer 22 and the resistance component 24.

Moreover, the square wave generating section 30 in the present example has a voltage source 32, a switch 34, and a resistance component 36. The voltage source 32 generates a voltage generally equal to amplitude of a square wave to be generated. Moreover, the voltage source 32 may generate a voltage V2 described in the equation (1). In this case, the voltage source 32 may have a variable power source and a control section. The control section may be supplied with a time constant of the low-pass filter 50 and an inclination of a waveform of a lamp wave, and control a voltage generated from the variable power source.

The switch 34 is provided between the voltage source 32 and an output port of the square wave generating section 30, and controls whether the voltage output from the voltage source 32 is output to the outside or not. The switch 34 is controlled in synchronization with the switch 14. In other words, the switch 34 is short-circuited or opened generally simultaneously with the switch 14. In this way, it is possible to synchronize the lamp wave generated from the lamp waveform generating section 10 and the square wave generated from the square wave generating section 30 and output these waves.

Moreover, the waveform adding section 40 in the present example has an inversion amplifier 42. The lamp wave generated from the lamp waveform generating section 10 and the square wave generated from the square wave generating section 30 are added to be input to an inversion input port of the inversion amplifier 42.

Moreover, the low-pass filter 50 in the present example has a capacitor 52 and a resistance component 54. The capacitor 52 and the resistance component 54 are provided in parallel between an output port and the inversion input port of the inversion amplifier 42.

In this configuration, amplitude V1 of a lamp wave component and amplitude V2 of a square wave component in the output port of the inversion amplifier 42 are given by the following equation. The voltage source 32 generates Vs in which V1 and V2 shown in an equation (2) seem to satisfy the equation (1).

$$V1 = (R2/R1) \times I \times Tr/C1$$

$$V2 = -(R2/R3) \times Vs \qquad (2)$$

In the equation (2), R1 shows a resistance value of the resistance component 24, R2 shows a resistance value of the resistance component 54, R3 shows a resistance value of the resistance component 36, I shows a current value generated from the current source 12, Vs shows a voltage value generated from the voltage source 32, and C1 shows a capacitance value of the capacitor 16. Moreover, a time constant $\tau$ of the low-pass filter 50 is given by a product of a capacitance value of the capacitor 52 and R2.

Moreover, a lamp wave is generated by charging the capacitor 16 in the present example, but a lamp wave may be generated by discharging the capacitor 16 in another example. In this case, the current source 12 generates an electric current by which the capacitor 16 is discharged.

Figure 5:
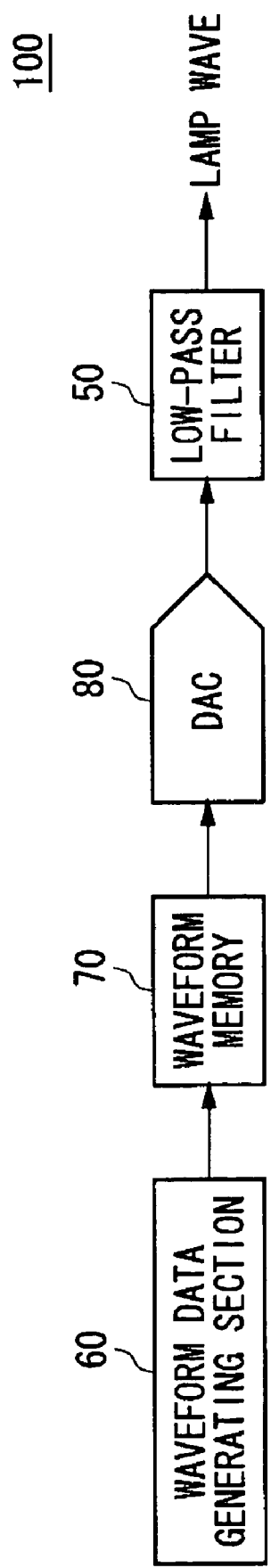
FIG. 5 is a view showing another example of a configuration of a waveform generator.

FIG. 5 is a view showing another example of a configuration of the waveform generator 100. The waveform generator 100 in the present example includes a waveform data generating section 60, a waveform memory 70, a digital-analog converter (hereinafter, referred to as a DAC) 80, and a low-pass filter 50.

The waveform data generating section 60 generates data obtained by converting a lamp wave and a square wave to be generated from the lamp waveform generating section 10 and the square wave generating section 30 described in reference to FIG. 1 into digital data. Moreover, the waveform data generating section 60 generates waveform data obtained by adding the digital data of the lamp wave and the square wave.

The waveform memory 70 stores the waveform data generated from the waveform data generating section 60. The DAC 80 converts the waveform data stored on the waveform data generating section 60 into an analog signal. The converted analog signal is generally equivalent to a signal obtained by adding the lamp wave and the square wave each generated from the lamp waveform generating section 10 and the square wave generating section 30 described in reference to FIG. 1. The low-pass filter 50 passes the signal output from the DAC 80. According to this configuration, it is also possible to generate a lamp wave with a low noise and a reduced distortion.

Figure 6:
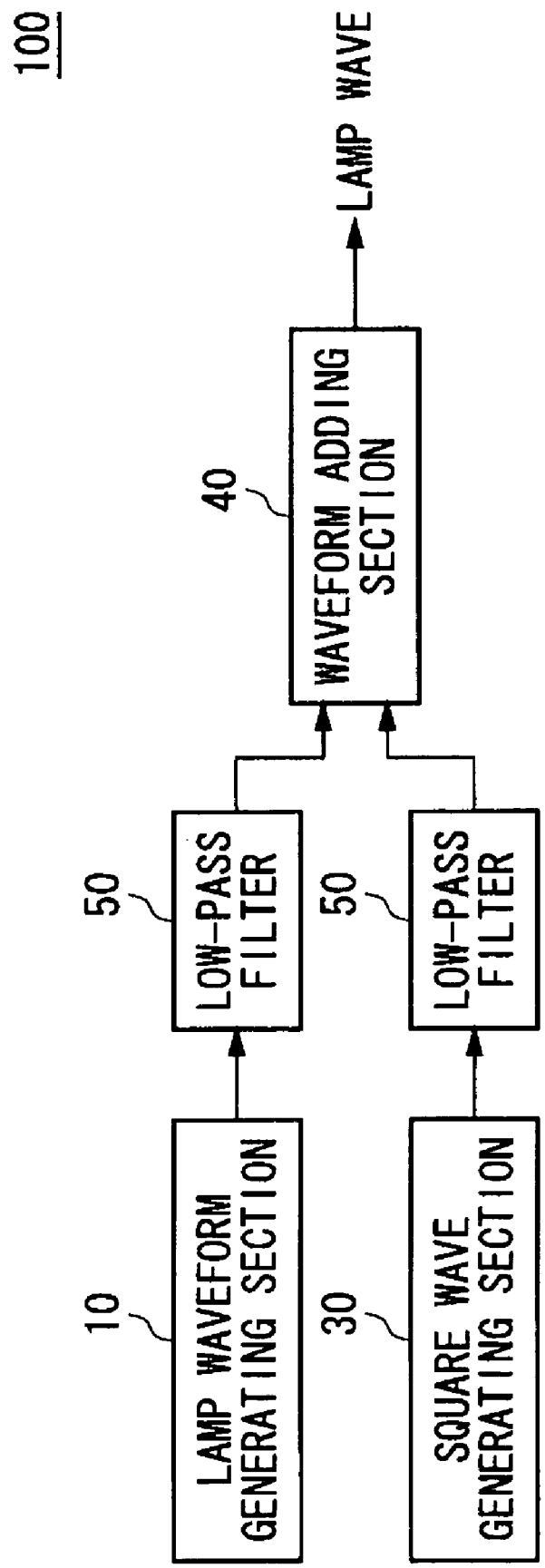
FIG. 6 is a view showing another example of a configuration of a waveform generator.

FIG. 6 is a view showing another example of a configuration of the waveform generator 100. A lamp wave and a square wave are added and then pass the low-pass filter 50 in the waveform generator 100 described in FIG. 1, but a lamp wave and a square wave respectively pass a low-pass filter 50 and then are added in the waveform generator 100 of the present example. The waveform generator 100 in the present example includes a lamp waveform generating section 10, a square wave generating section 30, two low-pass filters 50, and a waveform adding section 40. The lamp waveform generating section 10 and the square wave generating section 30 are the same as the lamp waveform generating section 10 and the square wave generating section 30 described in reference to FIG. 1.

The low-pass filters 50 are respectively provided corresponding to the lamp waveform generating section 10 and the square wave generating section 30. Each low-pass filter 50 is the same as the low-pass filter 50 described in FIG. 1. Moreover, each low-pass filter 50 has the generally same characteristic. In other words, the low-pass filter 50 corresponding to the lamp waveform generating section 10 removes a predetermined frequency component from a lamp wave output from the lamp waveform generating section 10, and the low-pass filter 50 corresponding to the square wave generating section 30 removes the predetermined frequency component from a square wave output from the square wave generating section 30.

The waveform adding section 40 adds signals output from the low-pass filters 50 and outputs the added signal as a lamp wave. According to this configuration, it is also possible to generate a lamp wave with a low noise and a small distortion.

Figure 7:
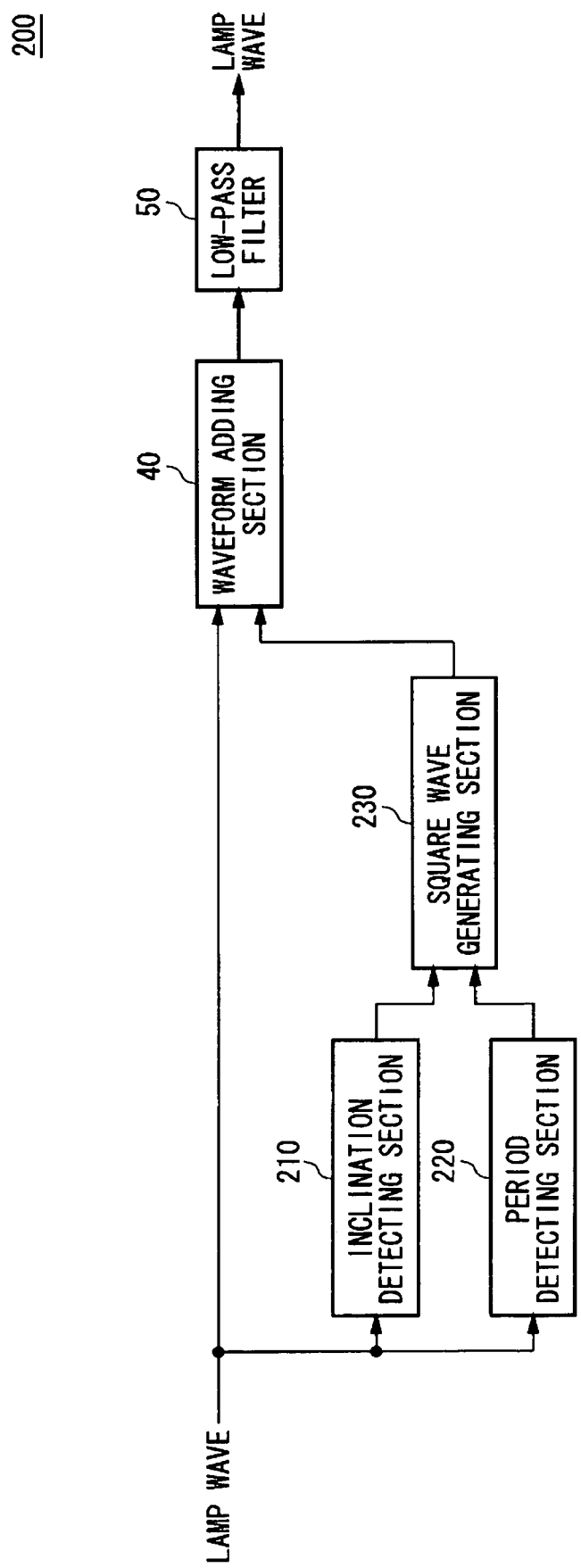
FIG. 7 is a view exemplary showing a configuration of a waveform shaper according to an embodiment of the present invention.

FIG. 7 is a view exemplary showing a configuration of a waveform shaper 200 according to an embodiment of the present invention. The waveform shaper 200 is an apparatus for removing noises from an input lamp wave to output the lamp wave, and includes an inclination detecting section 210, a period detecting section 220, a square wave generating section 230, a waveform adding section 40, and a low-pass filter 50.

The inclination detecting section 210 detects an inclination of a waveform of an input lamp wave. Moreover, the period detecting section 220 detects a period (Tr) for which a signal value in the input lamp wave linearly changes. The inclination detecting section 210 may detect an inclination of a waveform based on amplitude of the input lamp wave and the period detected from the period detecting section 220. Moreover, the inclination detecting section 210 and the period detecting section 220 may be informed of the inclination and period (Tr) of a lamp wave from an outside waveform generator for generating the lamp wave, or may be previously supplied with the inclination and period from a user.

The square wave generating section 230 generates a square wave having amplitude according to an inclination of a waveform of the lamp wave detected from the inclination detecting section 210 and a time constant of the low-pass filter 50 and pulse width according to the period detected from the period detecting section 220. The waveform adding section 40 and the low-pass filter 50 have the same functions and configurations as those of the waveform adding section 40 and the low-pass filter 50 described in reference to FIG. 1.

According to the waveform shaper 200 in the present example, it is possible to remove noises from the supplied lamp wave and output the lamp wave with a small distortion.

Figure 8:
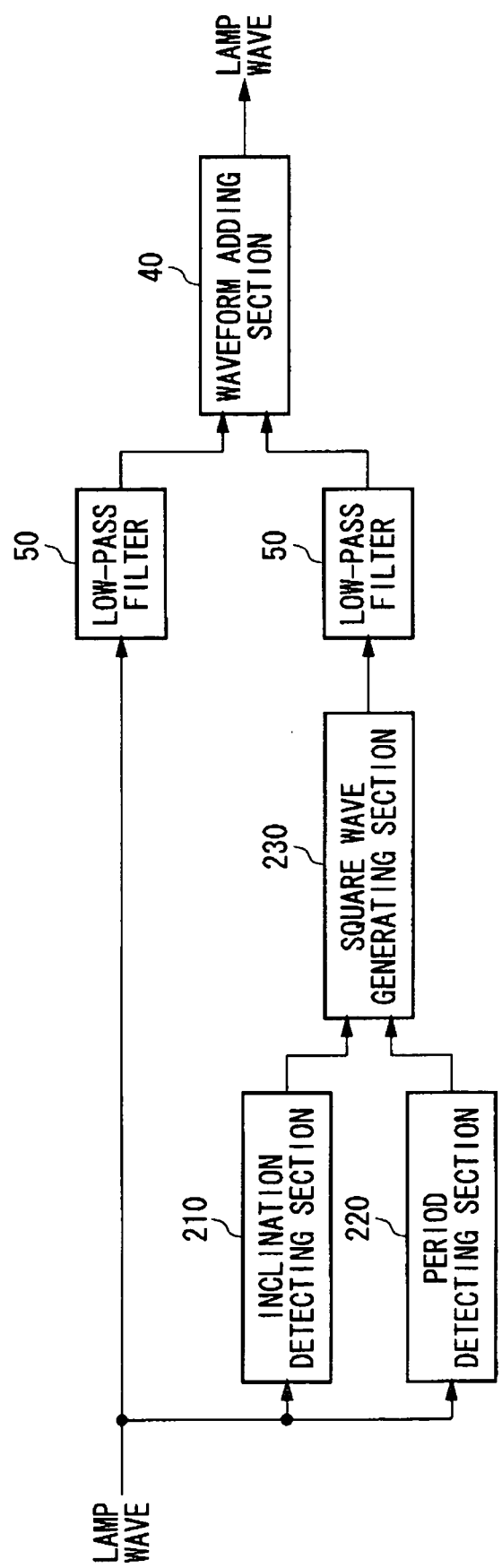
FIG. 8 is a view showing another example of a configuration of a waveform shaper.

FIG. 8 is a view showing another example of a configuration of the waveform shaper 200. The waveform shaper 200 in the present example adds a lamp wave and a square wave respectively passing low-pass filters 50 similarly to the waveform generator 100 described in FIG. 6. In other words, the waveform shaper 200 in the present example includes a first and a second low-pass filters 50 in place of the low-pass filter 50 in the configuration of the waveform shaper 200 described in FIG. 7.

The first low-pass filter 50 removes a predetermined frequency component from an input lamp wave and inputs the lamp wave to the waveform adding section 40. Moreover, the second low-pass filter 50 removes the predetermined frequency component from a square wave output from the square wave generating section 230 and inputs the square wave to the waveform adding section 40. These low-pass filters 50 have the generally same frequency characteristic.

According to such a configuration, it is also possible to remove noises from a supplied lamp wave and output a lamp wave having a small distortion.

Figure 9:
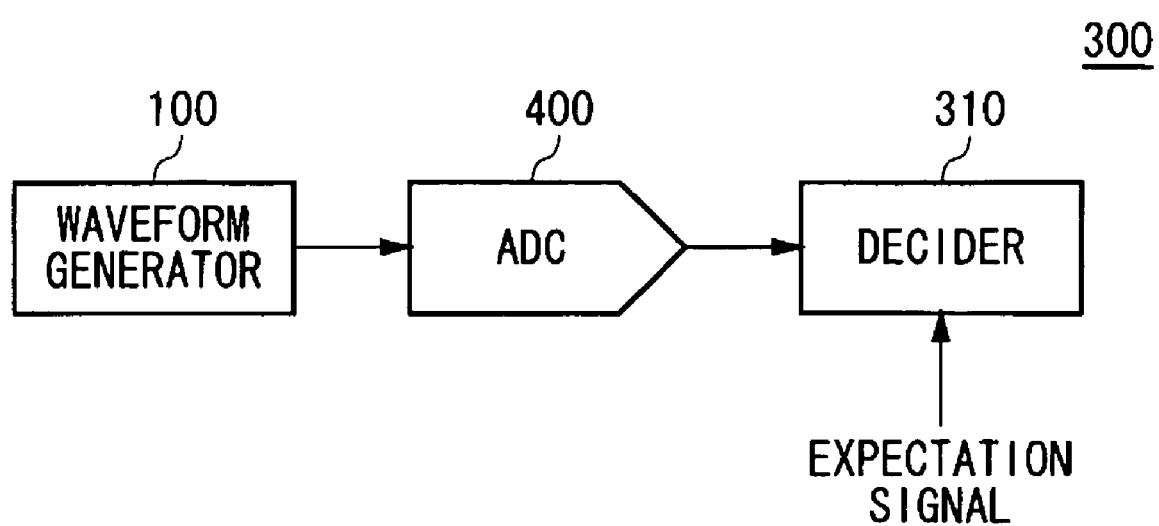
FIG. 9 is a view exemplary showing a configuration of a testing apparatus that tests an ADC.

FIG. 9 is a view exemplary showing a configuration of a testing apparatus 300 for testing an ADC 400. The testing apparatus 300 includes a waveform generator 100 and a decider 310. The waveform generator 100 is the same as the waveform generator 100 described in FIGS. 1 to 6. The waveform generator 100 inputs the generated lamp wave into the ADC 400.

The decider 310 decides the good or bad of the ADC 400 based on the digital signal output from the ADC 400 according to the lamp wave. For example, the decider 310 may compare a given expectation signal and the digital signal to decide the good or bad of the ADC 400.

According to the testing apparatus 300 of the present example, since the ADC 400 can be tested using a lamp wave with low noise and distortion, it is possible to decide the good or bad of the ADC 400 with high precision. Moreover, since a lamp wave can be generated at high speed, it is possible to efficiently test the ADC 400.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to generate a lamp wave with a reduced noise and a small waveform distortion.

What is claimed is:

1. A waveform generator that generates a waveform, comprising:
   a lamp waveform generating section that generates a lamp wave of which a signal value linearly changes for a predetermined period;
   a square wave generating section that generates a square wave of which pulse width is generally equivalent to the predetermined period;
   a waveform adding section that generally accords a timing at which a signal value in the lamp wave begins to be changed and a timing at a leading edge of the square wave, to add the lamp wave and the square wave; and
   a low-pass filter that removes a predetermined frequency band component from a waveform output from said waveform adding section.

2. A waveform generator that generates a waveform, comprising:
   a lamp waveform generating section that generates a lamp wave of which a signal value linearly changes for a predetermined period;
   a square wave generating section that generates a square wave of which pulse width is generally equivalent to the predetermined period;
   a first low-pass filter that removes a predetermined frequency band component from the lamp wave;
   a second low-pass filter that has the generally same characteristic as that of said first low-pass filter and removes the frequency band component from the square wave; and
   a waveform adding section that generally accords a timing at which a signal value in the lamp wave begins to be changed and a timing at a leading edge of the square wave, to add the lamp wave output from said first low-pass filter and the square wave output from said second low-pass filter.

3. The waveform generator as claimed in claim 1, wherein said square wave generating section generates the square wave that has amplitude according to an inclination of a waveform of the lamp wave for the predetermined period and a time constant of said low-pass filters.

4. The waveform generator as claimed in claim 3, wherein said square wave generating section generates the square wave that has amplitude according to a value made by multiplying an inclination of the waveform by the time constant.

5. The waveform generator as claimed in claim 3, wherein the waveform generator further comprises an inclination detecting section that detects an inclination of a waveform of the lamp wave, and
   said square wave generating section generates the square wave based on an inclination of the waveform detected from said inclination detecting section.

6. A waveform shaper that removes noises from an input lamp wave, comprising:
   an inclination detecting section that detects an inclination of a waveform of the lamp wave;
   a period detecting section that detects a period for which a signal value in the lamp wave linearly changes;
   a square wave generating section that generates a square wave according to an inclination of the waveform detected from said inclination detecting section and the period detected from said period detecting section;
   a waveform adding section that generally accords a timing at which a signal value in the lamp wave begins to be changed and a timing at a leading edge of the square wave, to add the lamp wave and the square wave; and
   a low-pass filter that removes a predetermined frequency band component from a waveform output from said waveform adding section.

7. A waveform shape that removes noises from an input lamp wave, comprising:
   an inclination detecting section that detects an inclination of a waveform of the lamp wave;
   a period detecting section that detects a period for which a signal value in the lamp wave linearly changes;
   a square wave generating section that generates a square wave according to an inclination of the waveform detected from said inclination detecting section and the period detected from said period detecting section;
   a waveform adding section that generally accords a timing at which a signal value in the lamp wave begins to be changed and a timing at a leading edge of the square wave, to add the lamp wave and the square wave; and a first low-pass filter that removes a predetermined frequency band component from the lamp wave;

a second low-pass filter that has the generally same characteristic as that of said first low-pass filter and removes the frequency band component from the square wave; and a waveform adding section that generally accords a timing at which a signal value in the lamp wave begins to be changed and a timing at a leading edge of the square wave, to add the lamp wave output from said first low-pass filter and the square wave output from said second low-pass filter.

8. A testing apparatus that tests an AD converter, comprising:

a waveform generator that generates a lamp wave to be input into the AD converter; and a decider that decides the good or bad of the AD converter based on a digital signal output from the AD converter according to the lamp wave, wherein said waveform generator comprises:
  a lamp waveform generating section that generates a lamp wave of which a signal value linearly changes for a predetermined period;
  a square wave generating section that generates a square wave of which pulse width is generally equivalent to the predetermined period;
  a waveform adding section that generally accords a timing at which a signal value in the lamp wave begins to be changed and a timing at a leading edge of the square wave, to add the lamp wave and the square wave; and
  a low-pass filter that removes a predetermined frequency band component from a waveform output from said waveform adding section.

9. A testing apparatus that tests an AD converter, comprising:

a waveform generator that generates a lamp wave to be input into the AD converter; and a decider that decides the good or bad of the AD converter based on a digital signal output from the AD converter according to the lamp wave, wherein said waveform generator comprises:
  a lamp waveform generating section that generates a lamp wave of which a signal value linearly changes for a predetermined period;
  a square wave generating section that generates a square wave of which pulse width is generally equivalent to the predetermined period;
  a first low-pass filter that removes a predetermined frequency band component from the lamp wave;
  a second low-pass filter that has the generally same characteristic as that of said first low-pass filter and removes the frequency band component from the square wave; and
  a waveform adding section that generally accords a timing at which a signal value in the lamp wave begins to be changed and a timing at a leading edge of the square wave, to add the lamp wave output from said first low-pass filter and the square wave output from said second low-pass filter.

10. The waveform generator as claimed in claim 2, wherein said square wave generating section generates the square wave that has amplitude according to an inclination of a waveform of the lamp wave for the predetermined period and a time constant of said low-pass filters.

11. The waveform generator as claimed in claim 10, wherein said square wave generating section generates the square wave that has amplitude according to a value made by multiplying an inclination of the waveform by the time constant.

12. The waveform generator as claimed in claim 10, wherein
  the waveform generator further comprises an inclination detecting section that detects an inclination of a waveform of the lamp wave, and
  said square wave generating section generates the square wave based on an inclination of the waveform detected from said inclination detecting section.

* * * * *